(12) United States Patent
Lee et al.

(10) Patent No.: US 8,421,538 B2
(45) Date of Patent: Apr. 16, 2013

(54) FEEDBACK AMPLIFIER

(75) Inventors: Sang-Heung Lee, Daejeon (KR); Hae Cheon Kim, Daejeon (KR); Eun Soo Nam, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 0 days.

(21) Appl. No.: 13/185,913

(22) Filed: Jul. 19, 2011

(65) Prior Publication Data

US 2012/0105158 A1    May 3, 2012

(30) Foreign Application Priority Data

Nov. 1, 2010   (KR) ...................... 10-2010-00107883

(51) Int. Cl.
*H03F 3/04*   (2006.01)

(52) U.S. Cl.
USPC ............................ 330/291; 330/308; 330/282

(58) Field of Classification Search .................. 330/308, 330/310–311, 98–100, 86, 291–293; 250/214 A, 250/214 AG
See application file for complete search history.

(56) References Cited

U.S. PATENT DOCUMENTS

| 7,157,977 B2 | 1/2007 | Lee et al. |
| 7,221,229 B2* | 5/2007 | Schrodinger ................. 330/308 |
| 7,268,628 B2* | 9/2007 | Noda ............................ 330/308 |
| 2009/0108937 A1 | 4/2009 | Yamaguchi |

FOREIGN PATENT DOCUMENTS

| JP | 10-242773 A | 9/1998 |
| JP | 2003-163544 A | 6/2003 |

* cited by examiner

*Primary Examiner* — Hieu Nguyen
(74) *Attorney, Agent, or Firm* — Rabin & Berdo, P.C.

(57) ABSTRACT

Provided is a feedback amplifier including: an amplification circuit unit to generate an output voltage by amplifying an input voltage inputted through an input terminal; an output circuit unit to output the generated output voltage through an output terminal; a feedback circuit unit to control the gain of the amplification circuit unit by determining a total feedback resistance value using an external control signal and controlling an input current while the total feedback resistance value is determined; and a bias circuit unit to apply a bias voltage to the feedback circuit unit.

7 Claims, 2 Drawing Sheets

FEEDBACK AMPLIFIER

CROSS-REFERENCE TO RELATED APPLICATIONS

This application is based on and claims priority from pending Korean Patent Application No. 10-2010-0107883, filed on Nov. 1, 2010, with the Korean Intellectual Property Office, the disclosure of which is incorporated herein in its entirety by reference.

TECHNICAL FIELD

The present disclosure relates to an optical communication system, and more particularly, to a feedback amplifier used as a preamplifier of an optical communication system.

BACKGROUND

A feedback amplifier used as a preamplifier of an optical communication system has an amplifier circuit to amplify an input signal. A feedback circuit is provided to control the level of an output voltage in the feedback amplifier and the feedback circuit includes a feedback resistor connected between an input terminal and an output terminal, and a feedback transistor connected to the feedback resistor in parallel. Herein, the feedback transistor receives a control signal through the base thereof to control the feedback current flowing through the feedback circuit, and control an output voltage.

There are two methods of applying the control signal to the base of the feedback transistor. That is, two methods include a method of generating the control signal by configuring an additional gain control signal generating circuit outside the feedback amplifier, and a method of generating the control signal by embedding a bias circuit inside the feedback amplifier.

FIG. 1 illustrates a circuit diagram of a feedback amplifier in the related art.

Referring to FIG. 1, a feedback amplifier 100 in the related art is connected between an input terminal IN and an output terminal OUT. Input terminal IN is connected to a photodiode PD connected to a power supply VCC. An input current corresponding to a cathode current of photodiode PD is supplied to input terminal IN.

Input terminal IN is connected to the base of a first NPN transistor 110. The collector of first NPN transistor 110 is connected to power supply VCC through a first resistor 120 and the base of a second NPN transistor 130. The collector of second NPN transistor 130 is connected to power supply VCC, and the emitter of second NPN transistor 130 is connected to output terminal OUT and to the ground terminal through a second resistor 140. Moreover, an emitter of first NPN transistor 110 is also grounded.

A feedback circuit 150 includes a feedback resistor 152 and a feedback transistor 154. Output terminal OUT is connected to the base of first NPN transistor 110 through feedback resistor 152. The emitter of feedback transistor 154 is connected to output terminal OUT, and the collector of feedback transistor 154 is connected to the base of first NPN transistor 110. A control signal V_AGC for controlling a feedback current is applied to the base of feedback transistor 154 from an external circuit (not shown).

In such feedback amplifier 100, in the case where control signal V_AGC having a low voltage is applied to the base of feedback transistor 154, feedback transistor 154 is in an OFF state while the impedance between the collector and the emitter of feedback transistor 154 fully increases. Therefore, it is considered that feedback transistor 154 is equivalent to an opened state and the transimpedance is equivalent to the resistance value of feedback resistor 152.

Thereafter, when control signal V_AGC increases, feedback transistor 154 is turned ON and therefore the impedance between the collector and the emitter of feedback transistor 154 is decreased. As a result, feedback resistor 152 and the impedance are connected to each other in parallel to decrease the transimpedance. Accordingly, the gain of feedback amplifier 100 is controlled in response to control signal V_AGC.

That is, in feedback amplifier 100, in the case where control signal V_AGC is changed in response to the input current, control signal V_AGC is determined based on the input current within a range in which an output voltage S100 is not saturated. In order to supply control signal V_AGC with a proper signal value, an additional gain control signal generating circuit should be configured, thereby supplying control signal V_AGC to feedback amplifier 100.

However, since the feedback amplifier in the related art merely controls the dynamic range by a turn-ON resistance of the feedback transistor, the feedback amplifier is limited in providing a wide dynamic range.

SUMMARY

The present disclosure has been made in an effort to provide a feedback amplifier providing a wider dynamic range than the related art.

An exemplary embodiment of the present disclosure provides a feedback amplifier including: an amplification circuit unit to generate an output voltage by amplifying an input voltage inputted through an input terminal; an output circuit unit to output the generated output voltage through an output terminal; a feedback circuit unit to control a gain of the amplification circuit unit by determining a total feedback resistance value using an external control signal and controlling an input current by a bias voltage applied while the total feedback resistance value is determined; and a bias circuit unit to apply the bias voltage to the feedback circuit unit.

According to the exemplary embodiments of the present disclosure, a wider dynamic range than that of the related art can be provided by providing a feedback amplifier that automatically controls a gain as an input current increases while a total feedback resistance value is determined by an external control signal.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

In the following detailed description, reference is made to the accompanying drawing, which form a part hereof. The illustrative embodiments described in the detailed description, drawing, and claims are not meant to be limiting. Other embodiments may be utilized, and other changes may be made, without departing from the spirit or scope of the subject matter presented here.

Figure 1:
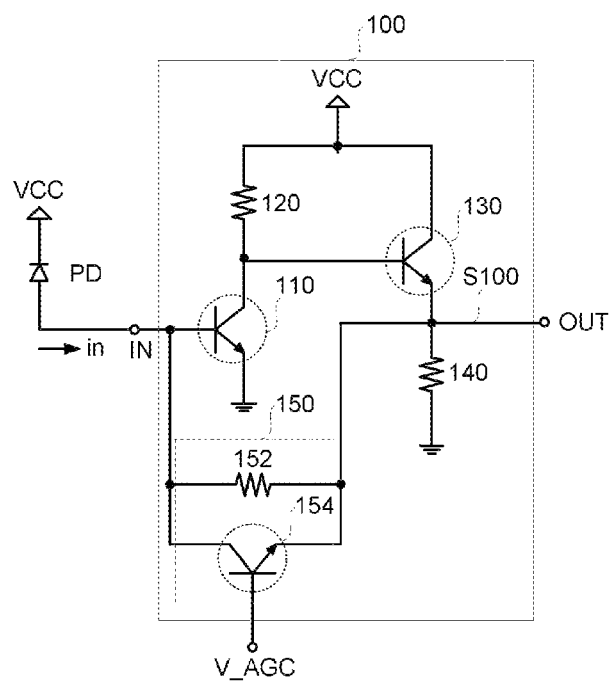
FIG. 1 is a diagram showing a circuit diagram of a feedback amplifier in the related art.
Figure 2:
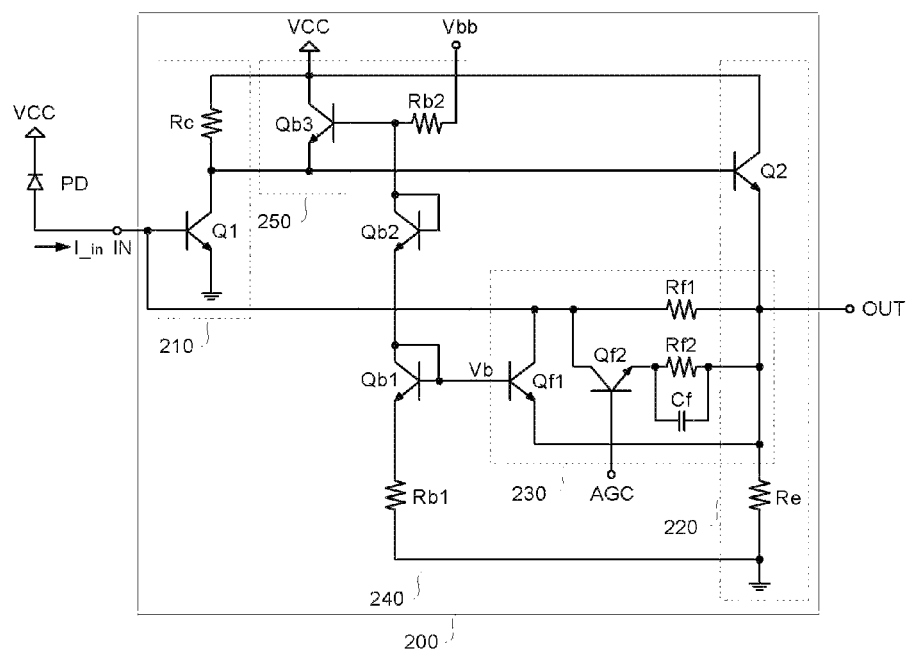
FIG. 2 is a diagram showing a circuit diagram of a feedback amplifier according to an exemplary embodiment of the present disclosure.

FIG. 2 is a diagram showing a circuit diagram of a feedback amplifier according to an exemplary embodiment of the present disclosure.

Referring to FIG. 2, a feedback amplifier 200 according to an exemplary embodiment of the present disclosure is connected between an input terminal IN and an output terminal OUT. Input terminal IN is electrically connected to a power supply VCC, and a photodiode PD is connected between input terminal IN and power supply VCC. As a result, photodiode PD detects an input voltage. Further, a cathode current I_in of photodiode PD is an input current of feedback amplifier 200 and the input current is provided to feedback amplifier 200 through input terminal IN.

Feedback amplifier 200 according to the exemplary embodiment of the present disclosure includes an amplification circuit unit 210, an output circuit unit 220, a feedback circuit unit 230, and a bias circuit unit 240, and may further include a phase compensation circuit unit 250.

Amplification circuit unit 210 includes a first transistor Q1 and a first resistor Rc and generates an output voltage by amplifying the input voltage inputted through input terminal IN.

The base of first transistor Q1 is connected to input terminal IN, the collector of first transistor Q1 is connected to power supply VCC through first resistor Rc, and the emitter of first transistor Q1 is grounded. Herein, as first transistor Q1, an NPN bipolar transistor may be used.

Output circuit unit 220 includes a second transistor Q2 and a second resistor Re, and outputs the output voltage generated by amplification circuit unit 210 through output terminal OUT. The base of second transistor Q2 is connected to the collector of first transistor Q1, the collector of second transistor Q2 is connected to power supply VCC, and an emitter of second transistor Q2 is grounded through second resistor Re. Herein, as second transistor Q2, an NPN bipolar transistor may be used like first transistor Q1.

Feedback circuit unit 230 includes a first feedback resistor Rf1 connected between input terminal IN and output terminal OUT, a first feedback transistor Qf1 connected to first feedback resistor Rf1 in parallel, a second feedback transistor Qf2 connected to first feedback resistor Rf1 in parallel, a second feedback resistor Rf2 connected to second feedback transistor Qf2 in series, and a feedback capacitor Cf connected to second feedback resistor Rf2 in parallel. The base of first feedback transistor Qf1 is connected to bias circuit unit 240, to be described below, that is, to the base of a first bias transistor Qb1 included in bias circuit unit 240. Therefore, first feedback transistor Qf1 receives a bias voltage Vb from bias circuit unit 240. The collector of first feedback transistor Qf1 is connected to input terminal IN and the emitter of first feedback transistor Qf1 is connected to output terminal OUT. Further, the base of second feedback transistor Qf2 that controls the resistance value of second feedback resistor Rf2 is connected to an external control signal AGC, the collector of second feedback transistor Qf2 is connected to input terminal IN, and the emitter of second feedback transistor Qf2 is connected to second feedback resistor Rf2.

Bias circuit unit 240 includes a first bias transistor Qb1, a second bias transistor Qb2, a first bias resistor Rb1, and a second bias resistor Rb2. Bias circuit unit 240 supplies bias voltage Vb to feedback circuit unit 230, that is, to first feedback transistor Qf1 included in feedback circuit unit 230. The base and the collector of first bias transistor Qb1 are commonly connected and the commonly connected base and collector are connected to the base of first feedback transistor Qf1, and the emitter of first bias transistor Qb1 is grounded through first bias resistor Rb1. Further, the base and the collector of second bias transistor Qb2 are commonly connected, and the emitter of second bias transistor Qb2 is connected to the collector of first bias transistor Qb1. In addition, second bias resistor Rb2 is connected between the collector of second bias transistor Qb2 and a bias input voltage Vbb.

Phase compensation circuit unit 250 is an NPN transistor Qb3. The base of NPN transistor Qb3 is connected to second bias resistor Rb2, the collector of NPN transistor Qb3 is connected to power supply VCC, and the emitter of NPN transistor Qb3 is connected to the collector of first transistor Q1. Phase compensation circuit unit 250 prevents an output waveform from being distorted as a feedback current amount increases.

Hereinafter, a detailed operation of feedback circuit unit 230 for an automatic gain controlling operation of feedback amplifier 200 will be described according to an exemplary embodiment of the present disclosure.

External control signal AGC is connected to the base of second feedback transistor Qf2, which serves as a switch. Accordingly, in the case where second feedback transistor Qf2 is turned OFF by external control signal AGC, the resistance value of first feedback resistor Rf1 becomes a total feedback resistance value to acquire a high gain. And in the case where second feedback transistor Qf2 is turned ON by external control signal AGC, first feedback resistor Rf1 and second feedback resistor Rf2 are connected to each other in parallel, such that the total feedback resistance value becomes smaller than the resistance value of first feedback resistor Rf1 to acquire a low gain.

Meanwhile, when the total feedback resistance value decreases, feedback amplifier 200 has a peak in a frequency response and needs to planarize the frequency response. To enable this, feedback capacitor Cf connected to second feedback resistor Rf2 in parallel is used. That is, feedback capacitor Cf compensates for the frequency response caused by the decrease of the total feedback resistance value.

In addition, since the base of first feedback transistor Qf1 included in feedback circuit unit 230 is connected to the base of first bias transistor Qb1 included in bias circuit unit 240, the operation of first feedback transistor Qf1 is fixed by bias voltage Vb supplied from bias circuit unit 240. That is, the impedance between the collector and the emitter of first feedback transistor Qf1 is controlled by the voltage level of output terminal OUT determined by bias voltage Vb.

As a result, when input current I_in is sufficiently small, since the voltage level of output terminal OUT does not almost deviate from an operation point (Q point), first feedback transistor Qf1 is in a turn-OFF state and it is regarded that the gap between the collector and the emitter of first feedback transistor Qf1 is opened. As a result, feedback circuit unit 230 is constituted merely by a total fixed resistor (by the external control signal, first feedback resistor Rf1 or a parallel resistor of first feedback resistor Rf1 and second feedback resistor Rf2) and a resistor of first feedback transistor Qf1, and performs substantially the same operation as a feedback amplifier without an auto gain control (AGC) function. Therefore, the voltage of output terminal OUT is substantially equivalent to the product of a total fixed resistance value (by the external control signal, a resistance value of first feedback resistor Rf1 or a parallel resistance value of first feedback resistor Rf1 and second feedback resistor Rf2) and input current I_in.

Further, when input current I_in increases sufficiently, first feedback transistor Qf1 is turned ON while the voltage level of output terminal OUT becomes gradually lower than operation point (Q-point). As a result, first feedback transistor Qf1 is electrically conducted to decrease the impedance between the collector and the emitter. Therefore, the decrease of the overall impedance of feedback circuit unit 230 results in the decrease of the gain of feedback amplifier 200 and finally the automatic gain control operation is performed.

The automatic gain control operation will be described in more detail. Since the base of first bias transistor Qb1 is connected to the base of first feedback transistor Qf1, a voltage with a diode turn-ON voltage level is applied to the base of first feedback transistor Qf1. Meanwhile, since the collector of first feedback transistor Qf1 is connected to the base of first transistor Q1 of amplification circuit unit 210, a DC voltage level as high as the diode turn-ON voltage level is also applied to the collector of first feedback transistor Qf1. As a result, the base and the collector of first feedback transistor Qf1 have a similar DC voltage level. When input current I_in increases in such a DC state (operation point state), the voltage of output terminal OUT is decreased by inverting amplification. In this case, since the output terminal and the emitter of first feedback transistor Qf1 are connected to each other, the voltage of the emitter of first feedback transistor Qf1 decreases to turn ON first feedback transistor Qf1. Since the base and the collector of first feedback transistor Qf1 have the same DC voltage level, first feedback transistor Qf1 has a structure in which the base and the collector are connected to each other, and as a result, performs a diode operation. Therefore, as a large amount of current flows, a resistance decreases. In this case, the base and the collector of first feedback transistor Qf1 are not connected to each other in order to control the turn-ON voltage of first feedback transistor Qf1 by bias voltage Vb. As described above, since the total feedback resistance of feedback circuit unit 230 (when the total resistance is set as Rf, the resistance value of Rf is the resistance value of first feedback resistor Rf1 or a parallel resistance value of first feedback resistor Rf1 and second feedback resistor Rf2) and first feedback transistor Qf1 are connected to each other in parallel, the total impedance Zf of feedback circuit unit 230 may be expressed by Equation 1 on the assumption that an ON resistor of first feedback transistor Qf1 is set as RQf.

$$Zf = Rf \| RQf \quad \text{Equation 1:}$$

According to Equation 1, when input current I_in increases, ON resistor RQf of first feedback transistor Qf1 decreases as described above, such that total feedback impedance Zf also decreases. Further, the gain of feedback circuit unit 230 may be described by Equation 2.

$$\text{gain} = V\text{out}/I\_\text{in} = -Zf \quad \text{Equation 2:}$$

According to Equation 2, since the gain of feedback circuit unit 230 becomes a negative feedback impedance, when input current I_in increases, the gain of feedback amplifier 200 automatically decreases. In this case, since the magnitude of a minimum input current I_in required to start the automatic gain control operation is determined by bias voltage Vb applied to the base terminal of first feedback transistor Qf1, the desired magnitude of minimum input current I_in may be arbitrarily set by adjusting bias voltage Vb.

Consequently, the voltage of the base terminal of first feedback transistor Qf1 is fixed by the voltage supplied by bias circuit unit 240 and the magnitude of the impedance between the collector and the emitter of first feedback transistor Qf1 is automatically controlled by the voltage level of output terminal OUT connected to the emitter thereof, and as a result, an additional gain control signal generating circuit is not required. Moreover, as input current I_in increases, the impedance of feedback circuit unit 230 decreases, and as a result, the gain of feedback amplifier 200 is automatically controlled. Therefore, feedback amplifier 200 according to the exemplary embodiment of the present disclosure can control the gain by decreasing the impedance of feedback circuit unit 230 as the input current increases, while the total feedback resistance value is determined depending on whether or not second feedback transistor Qf2 is opened using external control signal AGC. As a result, feedback amplifier 200 can operate in a relatively wider dynamic range.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A feedback amplifier, comprising:
    an amplification circuit unit configured to generate an output voltage by amplifying an input voltage inputted through an input terminal;
    an output circuit unit configured to output the generated output voltage through an output terminal;
    a feedback circuit unit configured to control gain of the amplification circuit unit by determining a total feedback resistance value using an external control signal and controlling an input current by a bias voltage applied while the total feedback resistance value is determined, the bias voltage determining a minimum value of the input current for starting automatic gain control; and
    a bias circuit unit configured to apply the bias voltage to the feedback circuit unit.

2. The feedback amplifier of claim 1, wherein the feedback circuit unit includes:
    a first feedback resistor connected between the input terminal and the output terminal;
    a second feedback resistor connected to the first feedback resistor in parallel;
    a second feedback transistor to be turned ON/OFF by the external control signal, and configured to control connection of the first feedback resistor and the second feedback resistor to determine the total feedback resistance value; and
    a first feedback transistor configured to control the input current by controlling impedance between a collector and an emitter thereof by the applied bias voltage.

3. The feedback amplifier of claim 2, wherein when the second feedback transistor is turned OFF by the external control signal, a resistance value of the first feedback resistor becomes the total feedback resistance value, and when the second feedback transistor is turned ON, a parallel resistance value becomes the total feedback resistance value, when the first feedback resistor and the second feedback resistor are connected to each other in parallel.

4. The feedback amplifier of claim 2, wherein the feedback circuit unit further includes a feedback capacitor to be connected to the second feedback resistor in parallel, and configured to compensate for a frequency response when the total feedback resistance value decreases.

5. The feedback amplifier of claim 2, wherein when the input current decreases to be equal to or less than a predetermined reference value, the first feedback transistor is turned OFF and does not perform an automatic gain control operation.

6. The feedback amplifier of claim 2, wherein when the input current increases to be equal to or more than a predetermined reference value, the first feedback transistor is turned ON and automatically controls the gain of the amplification circuit unit by the first feedback transistor.

7. The feedback amplifier of claim 1, further comprising a phase compensation circuit unit configured to prevent an output waveform from being distorted as a feedback current amount of the feedback circuit unit increases.

* * * * *